United States Patent
Tero

(10) Patent No.: US 7,379,010 B2
(45) Date of Patent: May 27, 2008

(54) EXTENSION OF ACCURACY OF A FLASH ADC BY 1-BIT THROUGH INTERPOLATION OF COMPARATOR OUTPUTS

(75) Inventor: John Philip Tero, Saratoga, CA (US)

(73) Assignee: Sigma Designs, Inc., Milpitas, CA (US)

( * ) Notice: Subject to any disclaimer, the term of this patent is extended or adjusted under 35 U.S.C. 154(b) by 0 days.

(21) Appl. No.: 11/553,464

(22) Filed: Oct. 26, 2006

(65) Prior Publication Data

US 2007/0096971 A1 May 3, 2007

Related U.S. Application Data

(60) Provisional application No. 60/733,064, filed on Nov. 2, 2005.

(51) Int. Cl.
*H03M 1/12* (2006.01)
(52) U.S. Cl. .................. 341/159; 341/155; 341/156
(58) Field of Classification Search ................ 341/159, 341/156, 155; 382/216
See application file for complete search history.

(56) References Cited

U.S. PATENT DOCUMENTS

| | | | | |
|---|---|---|---|---|
| 5,748,132 A | * | 5/1998 | Matsuzawa | 341/156 |
| 6,002,800 A | * | 12/1999 | Donelly et al. | 382/216 |
| 6,107,949 A | * | 8/2000 | Gross, Jr. | 341/159 |
| 6,720,901 B2 | * | 4/2004 | Nakamoto | 341/156 |

* cited by examiner

*Primary Examiner*—Jean B Jeanglaude
(74) *Attorney, Agent, or Firm*—Thelen Reid Brown Raysman & Steiner; Aaron Wininger

(57) ABSTRACT

ADC accuracy is increased by 1 bit by interpolation of comparator outputs in a comparator array, thereby increasing accuracy without significantly increasing power consumption and size. Specifically, an analog-to-digital converter includes a binary converter and a comparator array, which comprises a plurality of comparator blocks, each block having a primary comparator and an intepolating comparator. The intepolating comparator compares an output signal from the primary comparator with a negative output signal from a primary comparator of another block of the plurality of blocks to generate a least significant bit. The binary converter, which is coupled to the array, converts array output to binary code.

8 Claims, 5 Drawing Sheets

COMPARATORS 1-BIT EXTENDED

EXTENSION OF ACCURACY OF A FLASH ADC BY 1-BIT THROUGH INTERPOLATION OF COMPARATOR OUTPUTS

PRIORITY REFERENCE TO PRIOR APPLICATIONS

This application claims benefit of and incorporates by reference patent application Ser. No. 60/733,064, entitled "EXTENSION OF THE ACCURACY OF A FLASH ADC BY 1-BIT THROUGH INTERPOLATION OF THE COMPARATOR OUTPUTS," filed on Nov. 2, 2005, by inventor John Tero.

TECHNICAL FIELD

This application applies generally, but not exclusively, to wide band analog-to-digital converters where low power and minimum die area are important.

BACKGROUND

An analog-to-digital converter (ADC) for high frequency analog signals is invariably implemented using a 'flash' architecture where the applied analog input signal is compared against an array of equally spaced static voltage references. A separate voltage comparator is used to compare the analog input signal against each voltage reference. The output from the comparator is normally a logical signal, of value '1' or '0', indicating whether the analog input signal is higher or lower than the reference voltage. The comparator outputs are then decoded to produce a digital code word which is a representation of the analog input signal. Normally the comparator outputs are only sampled at particular time instances, using a suitable repetitive clock signal, so that a well defined time correlation can be achieved between the analog input signal and the digital output code.

In a conventional flash ADC every time the conversion accuracy is increased by 1-bit the size of the number of static voltage references and the number of comparators to perform the analog to digital operation must all increase by a factor of two. The complexity of the decoder to produce the output digital word from the ADC also increases by a factor of two. In addition, the power consumption of the analog interface circuit to the ADC increases since it has to drive more comparators whilst still maintaining adequate linearity specifications.

The result is an increase in both the area of the ADC by up to a factor of two for every 1-bit increase in the ADC accuracy together with a significant increase in power consumption in the analog interface circuits and the comparator array.

A technique for extending the accuracy of an ADC without significantly increasing complexity and without placing additional requirements on the analog interface is therefore extremely desirable.

SUMMARY

In embodiments of this invention the accuracy of an ADC is increased by 1-bit without increasing the number of reference voltage levels, the requirements placed on the analog interface preceding the ADC or the complexity of the decoder. Such a requirement may be, but is not restricted to, the need to improve the signal to noise ratio in a radio channel by a factor of two to extend the distance over which the channel can communicate but without significantly affecting the cost of associated integrated circuits.

Embodiments of the invention allows an ADC, already incorporated into an integrated circuit, to be increased in accuracy without significant changes to the mask design or power consumption and without substantially increasing the die area.

In an embodiment, the ADC comprises a comparator array and a binary converter coupled to the array. The array comprises a plurality of comparator blocks, each block comprising a primary comparator and an interpolating comparator. The interpolating comparator compares an output signal from the primary comparator with a negative output signal from a primary comparator of another block of the plurality of blocks to generate a least significant bit. The binary converter converts array output to binary code.

In an embodiment, a method comprises: receiving an analog input signal; comparing the signal to reference voltages; interpolating between reference voltages; converting comparison results to a binary code; and using the interpolating to generate a least significant bit.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make use of the invention and is provided in the context of a particular application and its requirements. Various modifications to the embodiment will be readily apparent to those skilled in the art and the principles defined herein may be applied to other embodiments and applications without departing from the spirit and scope of the invention. Thus the present invention is not intended to be limited to the embodiment shown but is to be accorded the widest scope consistent with the principles, features and teachings disclosed herein.

In the description of the drawings the sampling clock, normally present in the ADC, has been omitted. The sampling clock forces the comparators to make a decision on whether or not the analog input signal is higher or lower than a particular reference voltage at a particular instance in time. It is therefore normally, but not necessarily, incorporated into each comparator. This invention is applicable with or without the sampling clock and so, for reasons of clarity of description, has been omitted from the diagrams.

Figure 1:
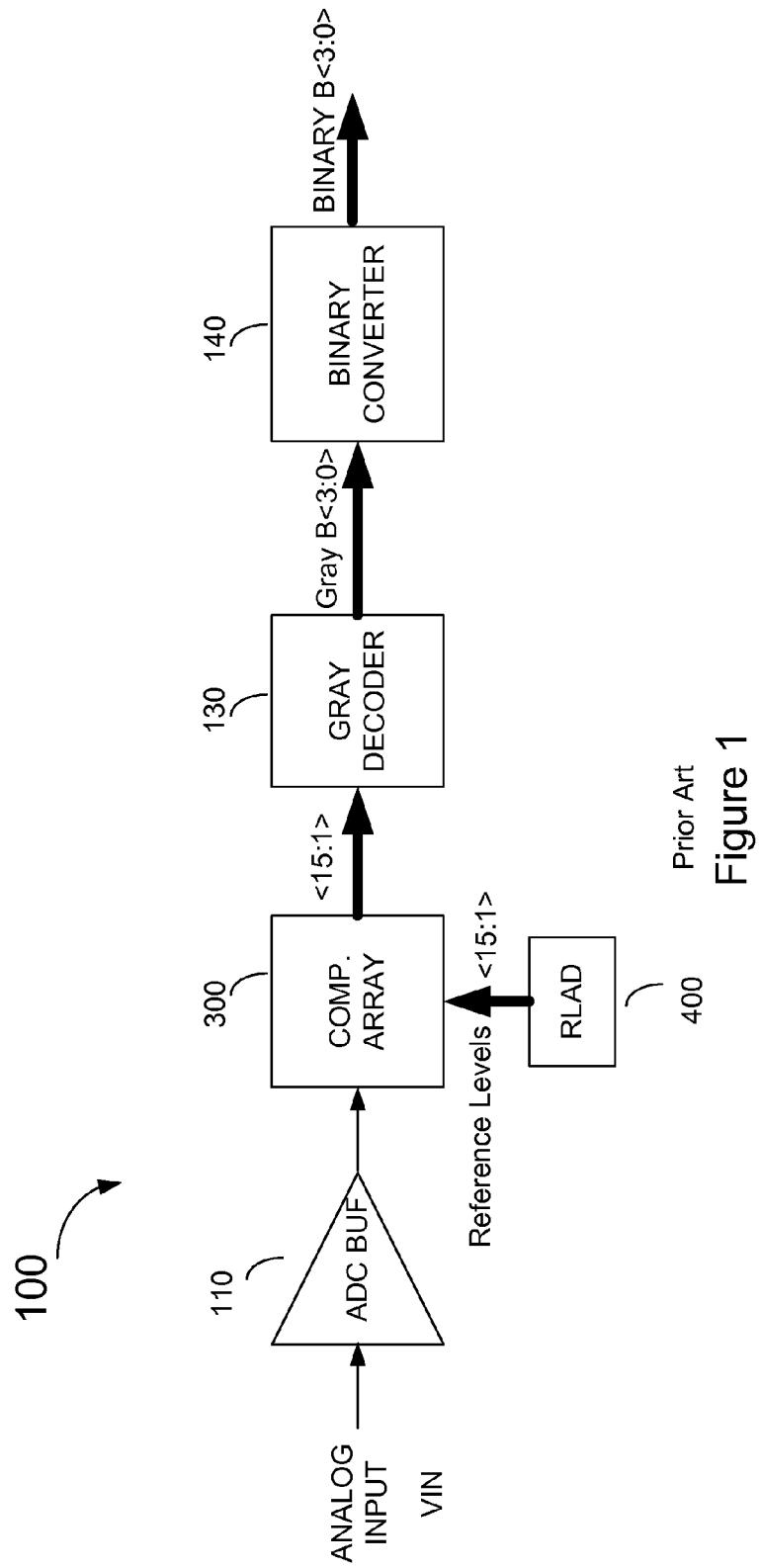
FIG. 1 is a block diagram illustrating an ADC using current art and before applying an embodiment of the present invention.

FIG. 1 is a block diagram illustrating a typical 'flash' ADC 100 but before employing an embodiment of the present invention. A 4-bit ADC is shown. An analog input signal VIN passes through an analog buffer 110, before entering a comparator array 300. The comparator array 300 comprises of a number of voltage comparators each associated with a different static reference voltage. Each comparator compares the analog input signal, VIN, to a particular reference voltage and produces a digital output signal represented by a logical value of '1' or '0'. If VIN is greater than the reference voltage the output of the comparator 300 is typically a logical value '1'. If VIN is less than the reference voltage the output of the comparator is typically a logical value '0'.

The voltage references are typically produced using a resistive ladder network 400. This network comprises of a string of equal valued resistors connected between two fixed voltage sources and produces a string of equally spaced reference voltages as in known to one of ordinary skill in the art. For a 4-Bit ADC there would be 15 reference voltage levels, 15 comparators in the comparator array 300 and 15 logical output signals passing to a decoder 130. The voltage difference between two adjacent reference voltages corresponds to the minimum change in analog input voltage required to produce a change of 1 least significant bit (LSB) in the ADC output code. For this reason the voltage difference between adjacent reference voltages is denoted by $V_{LSB}$ and is designated as the analog resolution of the ADC. The decoder 130 converts the comparator 300 outputs to a Gray code and then passes through a binary converter 140 to produce a binary output code from the ADC 100.

The logical outputs of the comparators 300 could be directly converted to a binary output code. For example the 15 outputs of a 4-bit converter could be directly decoded to a 4-bit binary output code. For wide band ADC implementations it is usual to decode the comparator outputs initially into a 4-bit Gray code and then convert the Gray code to a binary code. In a Gray code only one of the 4 bits changes state when the input analog signal changes by $V_{LSB}$ whereas in a binary code multiple bits could change. For example if the input signal moves between the eighth and ninth comparators of the 4-bit ADC the Gray code will change from 0100 to 1100 whereas the binary code would change from 0111 to 1000. A misreading of the ninth comparator in the comparator array 300 would result in an error of 1 LSB in the output of the Gray decoder 130 whereas, for a binary decoder, the error would be 7 LSB. Decoding first to a Gray code 130 and then converting to a binary code can reduce output errors significantly. The disadvantage of using a Gray decoder is that the complexity of the decoder increases by a factor of two whenever the ADC accuracy is increased by 1-bit.

Figure 2:
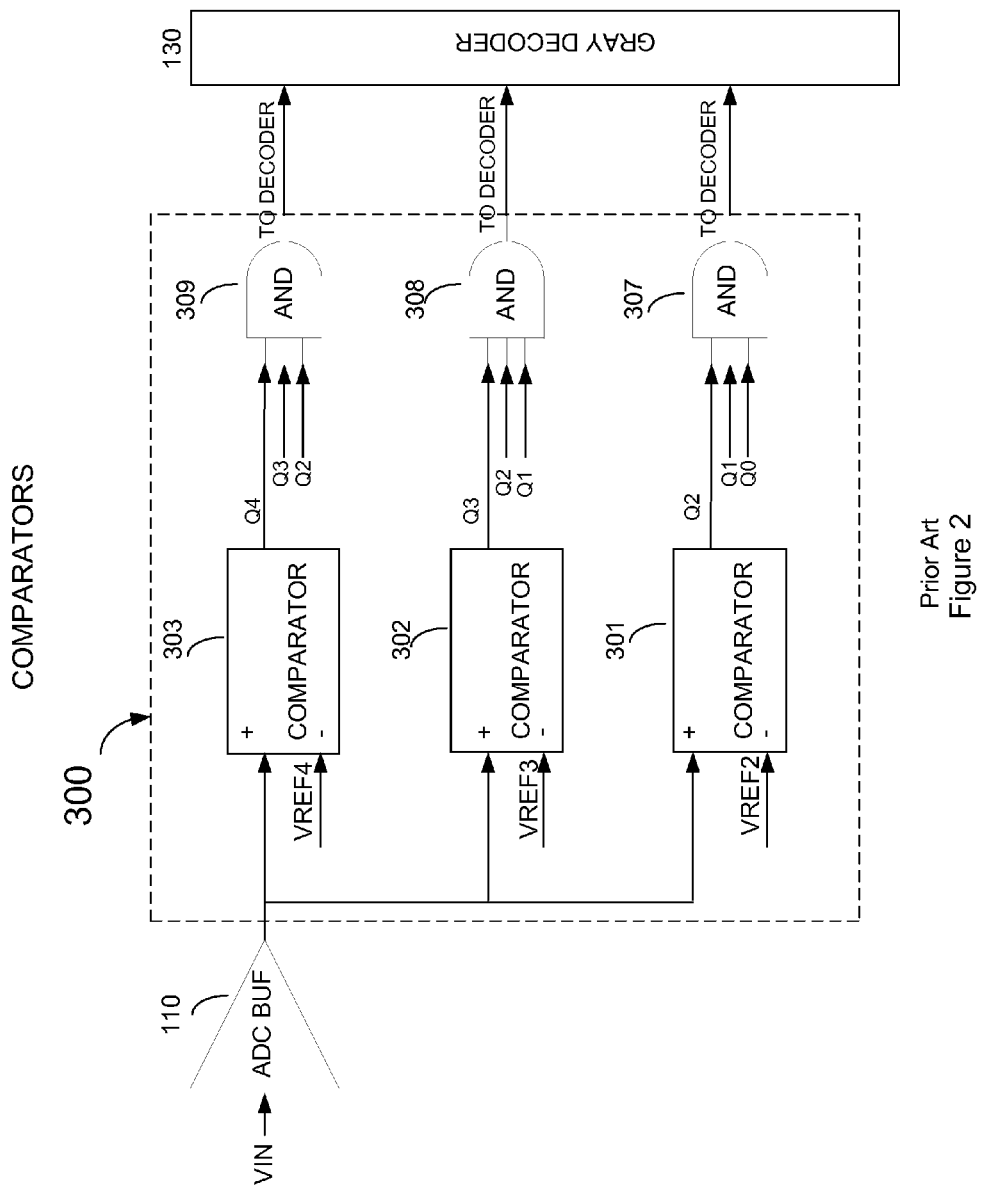
FIG. 2 is a block diagram illustrating a section of the comparator array of the ADC using current art and before applying an embodiment of the present invention.

FIG. 2 is a block diagram illustrating a section of the comparator array 300 of the ADC before applying an embodiment of the present invention. In this diagram the section of the comparator array 300 contains three comparators 301, 302 and 303 which compare the analog input signal directly against the reference voltages VREF2, VREF3 and VREF4 respectively. The comparator outputs are defined as Q2 for component 301, Q3 for component 302 and Q4 for component 303 and are all signals with logical values of '1' or '0'. Since, in this embodiment, the analog input signal is applied to the positive inputs of all of the comparators 301-303 while the reference voltage is applied to the negative input, the output signal will be a logical value '1' when VIN is higher than the reference voltage and a logical value of '0' when VIN is lower than the reference voltage.

These output signals from the comparators 301-303 then represent a thermometer code since, as VIN increase from a value less than VREF2 to a value greater than VREF4, first Q2, then Q3 and finally Q4 will change from a logical value '0' to a logical value '1'. In this format the output code is not suitable for use in the Digital Signal Processor machines that normally follow an Analog to Digital converter. Such a Digital Signal Processor requires typically a binary type code. For this reason the output signals are applied to the decoder 130 which, after subsequent processing, produces a binary output code.

It is typical in a 'flash' ADC to pass the output signals Q2, Q3 and Q4 through AND gates 307, 308 and 309, before they enter the decoder 130. Since the comparator outputs represent a thermometer code the AND gates 307-309 provide a simple error correction scheme. If the comparator connected to the voltage reference closest to the analog input signal level produces a logical value of '1' at its output it will be blocked from the decoder unless both the preceding comparators produced a logical value of '1'. This ensures that single errors in the thermometer code are corrected before the comparator outputs are passed to the decoder 130.

In general an ADC with an N-bit output code requires $(2^N-1)$ resistors for the voltage references and $(2^N-1)$ comparators and AND gates. The number of logic gates in the Gray decoder 130 is also approximately proportional to N.

For an analog resolution of $V_{LSB}$ the lowest reference voltage is $V_{LSB}$ and the highest is $(2^N-1)*V_{LSB}$. The peak value of the analog input signal is then $(2^N-1)*V_{LSB}$.

The buffer 110 must provide a linear transfer function up to this peak value of $(2^N-1)*V_{LSB}$ so as to maintain minimum distortion through the ADC 100. Since the buffer 110 must be able to drive the parallel inputs of the following $(2^N-1)$ comparators, with their associated input capacitances, it can be seen that, as N increases, so also does the linearity requirements placed on the buffer 110. This generally requires the buffer 110 to operate with higher bias currents and to dissipate more power especially when operating at high frequencies. It can be assumed that the power dissipated in the buffer 110 is approximately proportional to N.

The preceding descriptions illustrate that each time the conversion gain of a conventional flash ADC is increased by 1-bit the complexity, power consumption and die area also increase by a factor of approximately two.

Figure 3:
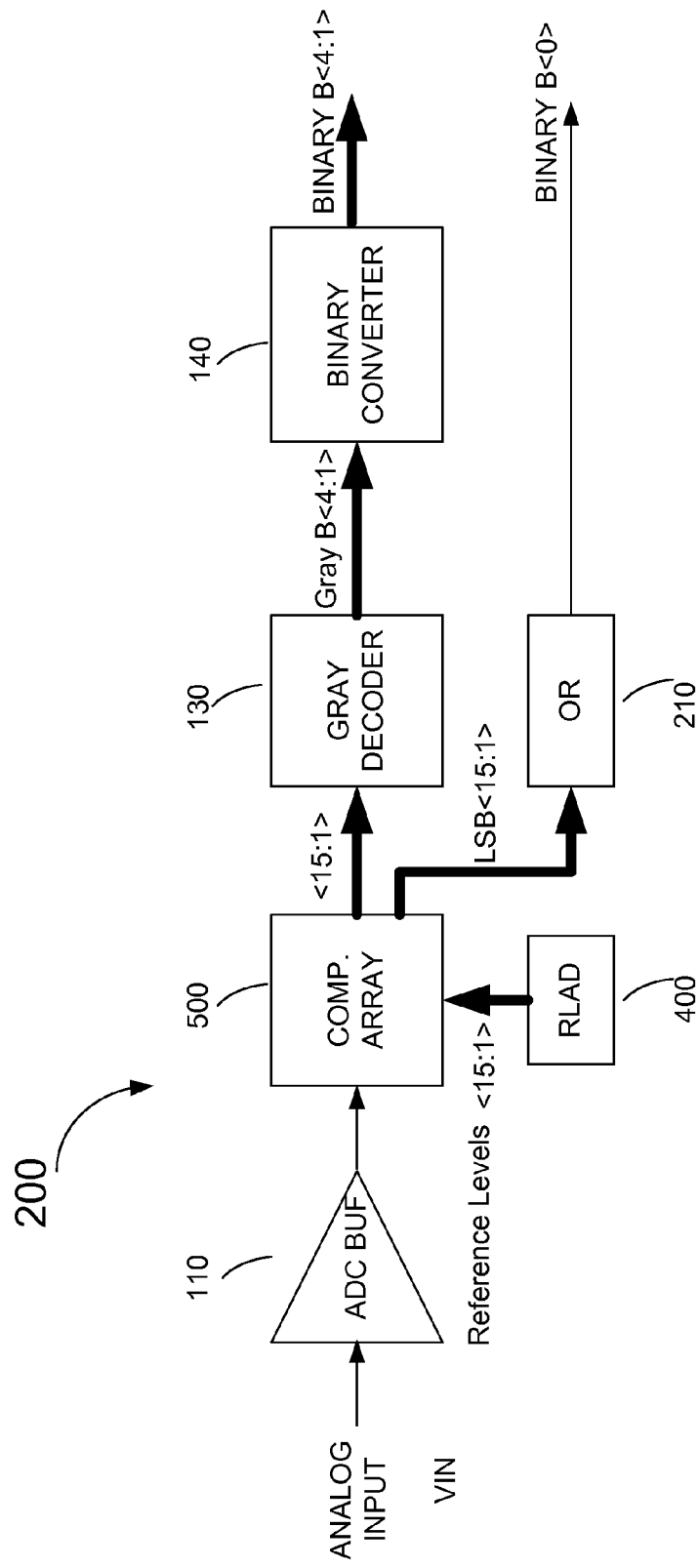
FIG. 3 is a block diagram illustrating an ADC according to an embodiment of the present invention.

FIG. 3 is a block diagram illustrating an ADC 200 according to an embodiment of the present invention. A 5-bit ADC 200 is shown to illustrate the extension of the 4-bit ADC 100 of FIG. 1 by an extra bit.

In this diagram the buffer 110, Gray decoder 130, Binary Converter 140 and reference level generator 400 remain unchanged. The comparator array 500 has replaced the previous comparator array 300 and a multiple input OR gate 210 has been added.

In this embodiment of the invention an additional bit (least significant bit or LSB) is added to the conversion gain of an ADC by interpolating between the comparator outputs of the comparator array 500. Each comparator can be regarded as a linear amplifier for input signals within $V_{LSB}$ of its reference level so its output is a linearly amplified version of the input signal. When the analog input signal is midway between the reference voltages of two adjacent comparators the negative output of the first comparator will be equal to the positive output of the adjacent comparator. A further comparator, referred to as an interpolating comparator, can then be added to decide when the input analog signal is higher or lower than this midpoint. This is equivalent to adding a further bit, or LSB, to the conversion gain of the ADC. Further logic can be added to ensure that the output of this interpolating comparator is ignored if the input analog signal does not lie between the two adjacent reference voltages. In this way it is only necessary to perform a logical OR function on the outputs of all interpolating comparators in the comparator array 500 in order to generate the LSB. In FIG. 3 the OR function 210 then generates the LSB (B<0>) while the Gray decoder 130 and Binary converter 140 generate the remaining bits.

The advantage of this technique is that the size of the reference resistor ladder, the number of reference voltages, the number of primary comparators, the input signal size and the drive capability of the ADC input buffer can all correspond to an ADC which is 1-bit smaller. Each of the original comparator blocks now incorporates an additional comparator which generates the interpolated LSB output but this is with a minimum of added power consumption and area. The extra LSB outputs are easily incorporated into a local error correction scheme that permits the LSB to bypass the Gray code decoder and the binary converter. The Gray decoder 130 and the Binary converter 140 remain unchanged.

The interpolation requires the gain of the comparator over an original LSB signal range be linear which is more easily achievable using a CMOS comparator than a bipolar comparator because of the lower transconductance of the former. However there is no fundamental reason why any manufacturing process could not incorporate this technique.

Figure 4:
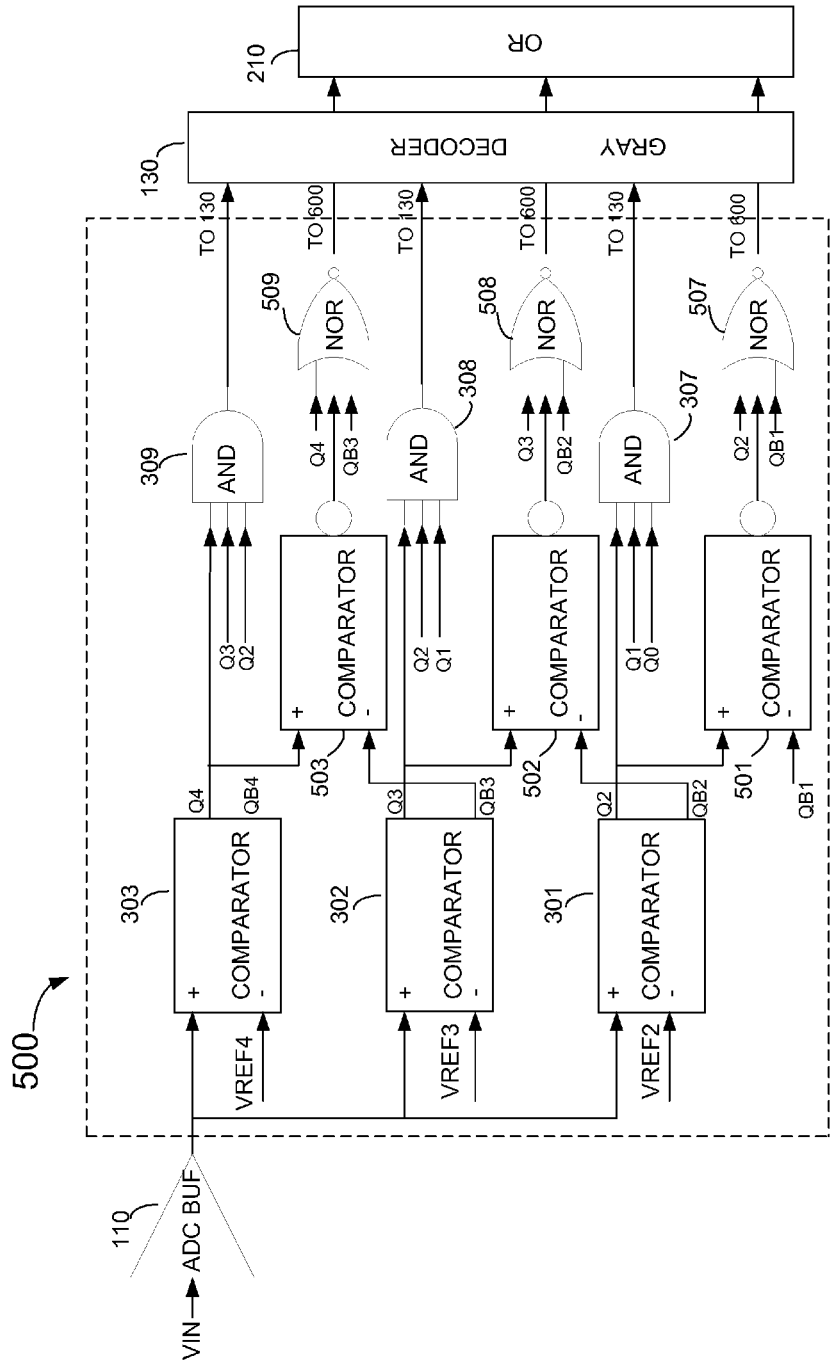
FIG. 4 is a block diagram illustrating a section of the comparator array of the ADC according to an embodiment of the present invention.

FIG. 4 is a block diagram illustrating a section of the comparator array 500 of the ADC 200 according to an embodiment the present invention. In this diagram of the section of the comparator array the comparators 301, 302 and 303 and the AND gates 307, 308 and 309 perform the same function as in FIG. 1. The reference voltages VREF2, VREF3 and VREF4 are also the same as in FIG. 1. Interpolating comparators 501, 502 and 503 together with NOR gates 507, 508 and 509 have been added.

Both the positive and negative output signals of the comparators 301, 302 and 303 are now generated to be compared in the interpolating comparators 501, 502 and 503. The negative signals are denoted as QB2, QB3 and QB4. For example signals Q3 and QB2 are connected to the positive and negative inputs of interpolating comparator 502. The negative output of interpolating comparator 502 is connected to one of the inputs of the NOR gate 508. If Q3 is higher than QB2 then the negative output of 502 is a logical value '0'. The other two inputs to the NOR gate 508 are Q3 and QB2. For the output of this NOR gate to be a logical value '1' then both Q3 and QB2 must have logical values of '0'. Therefore the output of NOR gate 508 can only indicate a logical value of '1' if the analog input signal lies between VREF2 and VREF3 and will always indicate a logical value of '0' for all other values of the analog input signal. All that is required from the LSB is to know if it has a logical value of '1' anywhere in the comparator array, otherwise it will be a logical value of '0'.

The LSB generated by combining all NOR gate outputs in the comparator array through a multiple input OR function 600. The outputs of the AND gates, as before in FIG. 1, enter the Gray decoder 130.

The analog buffer 110 only drives comparators 301, 302 and 303 as in FIG. 1 so its drive requirements remain unchanged.

Figure 5:
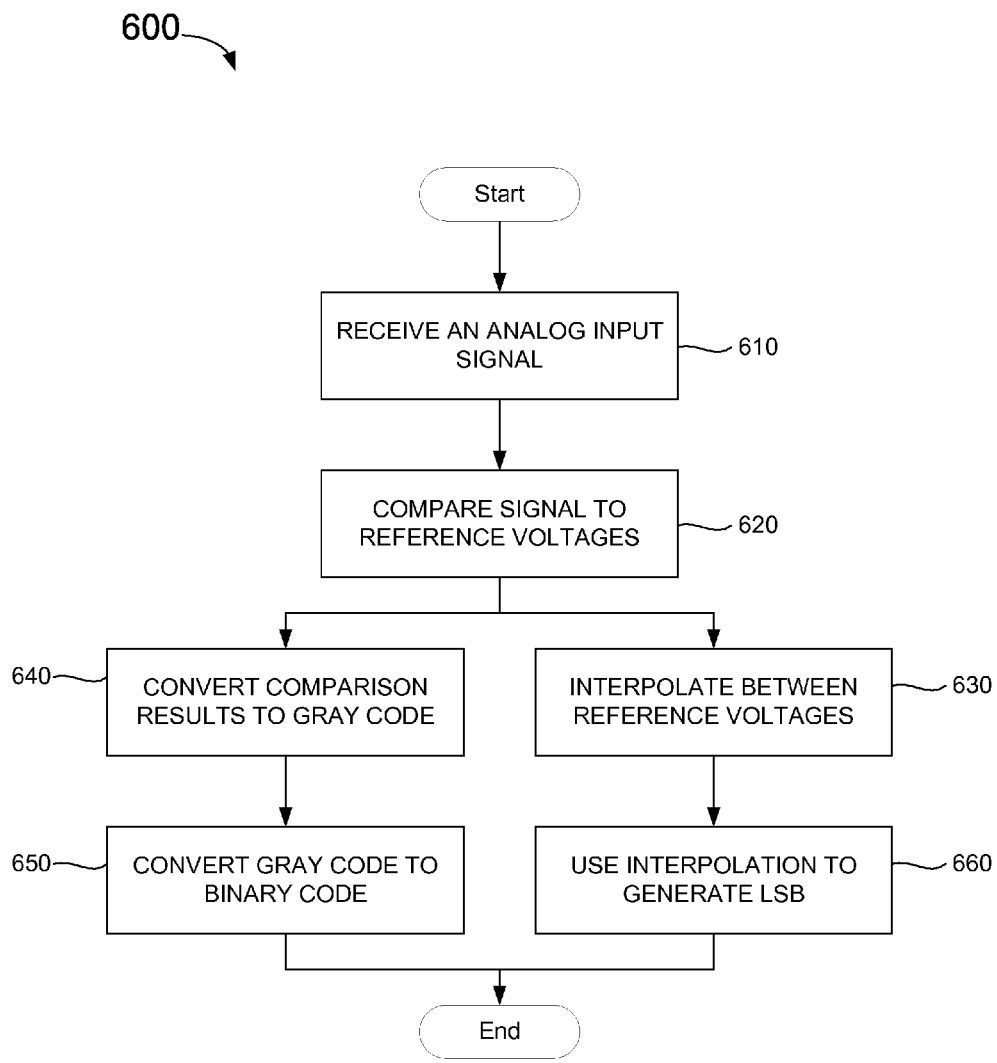
FIG. 5 is a flowchart illustrating a method of converting an analog signal to binary code.

FIG. 5 is a flowchart illustrating a method 600 of converting an analog signal to binary code. In an embodiment of the invention, the method 600 is executed by the ADC 200. First, an analog input signal is received (610). The signal is then compared (620) to reference voltages. Further, the signal is interpolated (630) between reference voltages to determine which reference voltage the signal is closest to. The comparison results are then converted (640) to Gray code, which is then converted (650) to binary code. The interpolation results are then used to generate (660) a least significant bit.

The foregoing description of the illustrated embodiments of the present invention is by way of example only, and other variations and modifications of the above-described embodiments and methods are possible in light of the foregoing teaching. For example, 1-bit extensions can be added to an ADC of number of bits, not just the 4 bit ADC illustrated. Further, components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. An analog-to-digital converter (ADC), comprising:
a comparator array, the array comprises a plurality of comparator blocks, each block comprising a primary comparator and an interpolating comparator, the interpolating comparator comparing an output signal from the primary comparator with a negative output signal from a primary comparator of another block of the plurality of blocks to generate a least significant bit; and
a binary converter, coupled to the array, that converts array output to binary code;
wherein each block further comprises a NOR gate communicatively coupled to the interpolating comparator.

2. The ADC of claim 1, wherein each primary comparator is associated with a different static reference voltage.

3. The ADC of claim 1, wherein the binary converter converts array output to binary code via a decoder communicatively coupled to the comparator array and binary converter that first converts array output to a Gray code, and wherein the binary converter converts the Gray code to binary code.

4. The ADC of claim 1, further comprising an OR gate communicatively coupled to the NOR gates of the array.

5. A system, comprising:
means for receiving an analog input signal;
means for comparing the signal to reference voltages;
means for interpolating between reference voltages;
means for converting comparison results to a binary code; and
means for using the interpolating to generate a least significant bit;
wherein the means for using includes means for passing the interpolation results to a NOR gate.

6. A method, comprising:
receiving an analog input signal;
comparing the signal to reference voltages;
interpolating between reference voltages;
converting comparison results to a binary code; and
using the interpolating to generate a least significant bit;
wherein the using includes passing the interpolation results to a NOR gate.

7. The method of claim 6, wherein the converting includes first converting the comparison results to a Gray code and subsequently converting the Gray code to binary code.

8. The method of claim 6, wherein the using further includes passing output of the NOR gate to an OR gate.

* * * * *